United States Patent
Lee et al.

(10) Patent No.: US 8,392,768 B2
(45) Date of Patent: Mar. 5, 2013

(54) MEMORY TEST SYSTEM WITH ADVANCE FEATURES FOR COMPLETED MEMORY SYSTEM

(75) Inventors: Chia-Hao Lee, Tainan (TW); Ming-Chuan Huang, Zhubei (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 219 days.

(21) Appl. No.: 13/064,513

(22) Filed: Mar. 30, 2011

(65) Prior Publication Data

US 2011/0302467 A1    Dec. 8, 2011

(30) Foreign Application Priority Data

Jun. 3, 2010  (TW) .............................. 99117957 A

(51) Int. Cl.
*G11C 29/00* (2006.01)

(52) U.S. Cl. ........................ 714/718; 714/726; 714/733

(58) Field of Classification Search .................. 714/718, 714/726, 733
See application file for complete search history.

(56) References Cited

U.S. PATENT DOCUMENTS

| | | | |
|---|---|---|---|
| 4,481,627 A | 11/1984 | Beauchesne et al. |
| 4,835,744 A | 5/1989 | Todd et al. |
| 5,155,844 A | 10/1992 | Cheng et al. |
| 5,657,443 A | 8/1997 | Krech, Jr. |
| 5,682,472 A | 10/1997 | Brehm et al. |
| 5,912,852 A | 6/1999 | Lawrence et al. |
| 6,047,393 A | 4/2000 | Yamada |
| 6,131,149 A | 10/2000 | Lu et al. |
| 6,154,860 A | 11/2000 | Wright et al. |
| 6,182,257 B1 | 1/2001 | Gillingham |
| 6,230,290 B1 | 5/2001 | Heidel et al. |
| 6,253,340 B1 | 6/2001 | Cowles et al. |
| 6,415,403 B1 | 7/2002 | Huang et al. |
| 6,715,096 B2 | 3/2004 | Kuge |
| 6,940,768 B2 | 9/2005 | Dahlberg et al. |
| 7,315,969 B2 | 1/2008 | Jakobs |
| 7,355,387 B2 | 4/2008 | LaBerge |

*Primary Examiner* — Sam Rizk
(74) *Attorney, Agent, or Firm* — Bacon & Thomas, PLLC

(57) ABSTRACT

In a memory test system with advance features for completed memory system, the hardware components are independently configured to generate versatile test patterns for performing a programmable-loading test, a real case test, and a write-feedback test. The write-feedback test is employed to independently test a memory controller which is embedded in an integrated circuit without communicating with the external SDRAM. In the integrated circuit verification stage, the memory test system supports for analyzing and distinguishing the problems inside or outside of the integrated circuit, and testing individual write and read commands.

10 Claims, 10 Drawing Sheets

|        | DRAM bus to System bus Command Ratio | HLS Adapt Factor |
|--------|--------------------------------------|------------------|
| Mode 0 | 4                                    | X1/4             |
| Mode 1 | 2                                    | X1/2             |
| Mode 2 | 1                                    | X1               |
| Mode 3 | 1/2                                  | X2               |
| Mode 4 | 1/4                                  | X4               |

|  | Total DRAM bus to System bus width ratio | HLS Adapt Factor |
| --- | --- | --- |
| mode 0 | 1/16 | X16 |
| mode 1 | 1/8 | X8 |
| mode 2 | 1/4 | X4 |
| mode 3 | 1/2 | X2 |
| mode 4 | 1 | X1 |
| mode 5 | 2 | X1/2 |
| mode 6 | 4 | X1/4 |
| mode 7 | 8 | X1/8 |
| mode 8 | 16 | X1/16 |

FIG. 9

System Bus Address Mapping

| | | | | | | | |
| --- | --- | --- | --- | --- | --- | --- | --- |
| mode 0 | D 1/4(2/4, 3/4, 4/4) | | | | | | |
| mode 1 | D 1/2 (2/2) | | | | | | |
| mode 2 | D0 | | | | | | |
| mode 3 | D0 | | | | D1 | | |
| mode 4 | D1 | | | | D0 | | |
| mode 5 | D3 | | D2 | | D1 | | D0 |
| mode 6 | D0 | | D1 | | D2 | | D3 |
| mode 7 | D3 | | D1 | | D2 | | D0 |
| mode 8 | D0 | | D2 | | D1 | | D3 |
| mode 9 | D7 | D6 | D5 | D4 | D3 | D2 | D1 | D0 |
| mode 10 | D0 | D1 | D2 | D3 | D4 | D5 | D6 | D7 |

FIG. 10

MEMORY TEST SYSTEM WITH ADVANCE FEATURES FOR COMPLETED MEMORY SYSTEM

BACKGROUND OF THE INVENTION

1. Field of the Invention

The present invention relates to the technical field of dynamic random access memory (DRAM) and, more particularly, to a memory test system with advance features for completed memory system.

2. Description of Related Art

For the past years, with the advance of semiconductor processes, the capacity of cells in a synchronous dynamic random access memory (SDRAM) can be as high as 4 Giga bytes or more. The amount of data transfer at each data pad can reach up to 1600 bps/pin or more. In a SDRAM system, the SDRAM has rapidly increased in density and speed, and the transmission speed required for the electrical signal on the traces of the PCB connecting the pins of the integrated circuit (IC) is also increased rapidly. Accordingly, the SDRAM becomes an essential storage for either personal computer systems or consumer electronic products, and plays the role of a main memory.

Since SDRAM has very high density and fast operating speed, a SDRAM access system is required for accessing and handling the SDRAM. The SDRAM access system generally includes a memory controller, a high speed pad, a high speed package, a PCB, and at least one SDRAM.

The memory controller and the high speed pad are disposed in an IC. The high speed package is a communication interface between the IC and the PCB. The traces on the PCB connect the pins of the IC and the SDRAM. The memory controller includes digital and analog circuits. The digital circuit converts signals of a system bus into the SDRAM signals. The analog circuit processes the analog signals, and handles the external data and commands that are inputted to or outputted from the IC.

The high speed package solves the problem of high speed signals communicating from the IC to the external SDRAM. By means of the traces on the PCB, the SDRAM is used as a storage device at the terminal of the access system. As cited, a completed memory access system has multiple signal paths, and is a complicated and multi-field system.

In addition to the complicated system design, the signal integrity and the power integrity in designing a high speed memory access system have the dominant impact on system stability and smooth operation. Due to the advanced SDRAM standards, designing a higher performance and quality memory system is required for operating at higher speed and lower working voltage at the signal integrity and the power integrity.

Since the memory access system has multiple signal paths, verifying the memory access system becomes more and more difficult in the advanced SDRAM standards. For a computer or embedded system, the verification and test method for a memory access system becomes more and more difficult and important.

In the technical field of memory tests, various memory test methods are proposed. A build-in-self-test (BIST) is widely used, which implements a BIST circuit in the SDRAM to test the cells, controller, and peripheral circuits inside the SDRAM. U.S. Pat. Nos. 6,154,860, 6,182,257, 6,253,340, 6,230,290, and 6,415,403 are related to the BIST issues. However, the BIST circuit can test only the internal circuits of the SDRAM, not for the entire SDRAM system containing the memory controller, high speed pad, high speed package, PCB, and SDRAM. Namely, the BIST circuit cannot test the entire SDRAM system.

U.S. Pat. No. 6,131,149 granted to Lu, et al. for an "Apparatus and method for reading data from synchronous memory with skewed clock pulses" has disclosed a test method related to a static random access memory (SRAM). However, the complexity of a SRAM is much lower than that of a SDRAM. U.S. Pat. No. 6,047,393 granted to Yamada for "Memory testing apparatus" has disclosed a test method related to a direct current (DC) for a memory, which cannot meet with the requirement of a modern SDRAM access system.

In the known patents, such as U.S. Pat. No. 6,715,096 granted to Kuge for "Interface circuit device for performing data sampling at optimum strobe timing by using stored data window information to determine the strobe timing", U.S. Pat. No. 6,940,768 granted to Dahlberg, et al. for "Programmable data strobe offset with DLL for double data rate (DDR) RAM memory", and U.S. Pat. No. 7,355,387 granted to LaBerge for "System and method for testing integrated circuit timing margins", there is disclosed a test method related to the timing residual of a SDRAM interface, which does not introduce different operating means and conditions, and the result is obtained at the optimal conditions only, not at the poorer conditions.

U.S. Pat. No. 4,835,744 granted to Todd, et al. for a "Marine seismic data acquisition system and method" has disclosed a completed test system with comparative data memory which uses a data memory to handle the test data to be compared. However, such a way increases the system cost.

U.S. Pat. No. 4,481,627 granted to Beauchesne, et al. for an "Embedded memory testing method and apparatus" has disclosed a testing method for an embedded memory, which can be used only in an embedded memory because there are no high speed pad and circuit board.

U.S. Pat. No. 5,657,443 granted to Krech, Jr. for an "Enhanced test system for an application-specific memory scheme" has disclosed a test system for testing all cells of a SDRAM, which cannot test the entire SDRAM system because, in addition to the SDRAM, a memory controller, a high speed pad, a high speed package, and a PCB are included in the SDRAM system.

U.S. Pat. No. 5,912,852 granted to Lawrence, et al. for a "Synchronous memory test method" has disclosed a SDRAM test method to find a SDRAM digital protocol.

U.S. Pat. No. 5,682,472 granted to Brehm, et al. for a "Method and system for testing memory programming devices" and U.S. Pat. No. 7,315,969 granted to Jakobs for a "Memory module with a test device" have disclosed a multi-SDRAM test method focusing on how to effectively test multiple SDRAMs.

In U.S. Pat. No. 5,155,844 granted to Cheng, et al. for a "Background memory test during system start up", a test is performed before the SDRAM is normally accessed to thereby verify the cells of the SDRAM. Such a way cannot test the SDRAM at a normal access, and especially at high loading.

Therefore, it is desirable to provide an improved memory test system to mitigate and/or obviate the aforementioned problems.

SUMMARY OF THE INVENTION

An object of the present invention is to provide a reliable memory test system to overcome the test problems caused by the high speed memory controller, memory interface, and SDRAM. The hardware components of the invention can be independently configured to generate versatile test patterns.

Another object of the present invention is to provide a reliable memory test system to perform a programmable loading test, a real case test, and a write-feedback test. Accordingly, the test system is highly reliable. Moreover, the write-feedback test can independently test a memory controller which is embedded in an integrated circuit without communicating with the external SDRAM. In the integrated circuit verification stage, the invention can give a support for analyzing and distinguishing the problems inside or outside of the integrated circuit, and testing a write command and a read command individually.

According to one aspect of the invention, a memory test system with advance features for completed memory system is provided, which includes: a synchronous dynamic random access memory (SDRAM) for storing data; a system bus for sending a system bus command from a master; a SDRAM controller connected to the system bus for processing the system bus command and generating a SDRAM standard command; a high speed pad connected to the SDRAM controller and to the SDRAM through a PCB circuitry path for receiving and sending an electrical signal of the SDRAM; and a programmable loading test system for generating a test command to the SDRAM. The programmable loading test system includes: a mode register controller for selecting and configuring a test mode for the programmable loading test system; a programmable loading command sequence generator connected to the mode register controller and the SDRAM controller for generating a programmable loading command sequence and a general purpose command sequence based on a configuration of the mode register controller; a programmable loading command address generator connected to the mode register controller and the SDRAM controller for generating a programmable loading command address and a general purpose command address based on the configuration of the mode register controller; a programmable loading data burst length generator connected to the mode register controller and the SDRAM controller for generating a programmable loading data burst length and a general purpose data burst length based on the configuration of the mode register controller; a programmable loading write data background generator connected to the mode register controller and the SDRAM controller for generating a programmable loading write data background and a general purpose write data background based on the configuration of the mode register controller; and a read data background checker connected to the mode register controller and the SDRAM controller for checking a read data output by the SDRAM controller based on the configuration of the mode register controller.

According to another aspect of the invention, a memory test system with advance features for completed memory system is provided, which includes: a SDRAM for storing data; a system bus for sending a system bus command from a master; a SDRAM controller connected to the system bus for processing the system bus command and generating a SDRAM standard command; a write path circuit connected to the SDRAM controller for providing a write path; a read path circuit connected to the SDRAM controller for providing a read path; a high speed pad connected to the write path circuit and the read path circuit for receiving and sending an electrical signal of the SDRAM through a PCB circuitry path; and a programmable loading test system for generating a test command to the SDRAM. The programmable loading test system includes: a mode register controller for selecting and configuring a test mode for the programmable loading test system; a programmable loading command sequence generator connected to the mode register controller and the SDRAM controller for generating a programmable loading command sequence and a general purpose command sequence based on a configuration of the mode register controller; a programmable loading command address generator connected to the mode register controller and the SDRAM controller for generating a programmable loading command address and a general purpose command address based on the configuration of the mode register controller; a programmable loading data burst length generator connected to the mode register controller and the SDRAM controller for generating a programmable loading data burst length and a general purpose data burst length based on the configuration of the mode register controller; a programmable loading write data background generator connected to the mode register controller and the SDRAM controller for generating a programmable loading write data background and a general purpose write data background based on the configuration of the mode register controller; a read data background checker connected to the mode register controller and the SDRAM controller for checking a read data output by the SDRAM controller based on the configuration of the mode register controller; and a write feedback checker connected to the SDRAM controller for receiving a write data and comparing the received write data with a feedback write data by the SDRAM controller; wherein the write path circuit is short-circuited and the read path circuit is open-circuited when a memory write data test is performed on the SDRAM, and the read path circuit is connected to the write path circuit for feeding the write data back to the write feedback checker when a memory write feedback test is performed on the SDRAM.

According to a further aspect of the invention, a memory test system with advance features for completed memory system is provided, which includes: a SDRAM for storing data; a system bus for sending a system bus command from a master; a SDRAM controller connected to the system bus for processing the system bus command and generating a SDRAM standard command; a write path circuit connected to the SDRAM controller for providing a write path; a read path circuit connected to the SDRAM controller for providing a read path, wherein the read path circuit includes a demultiplexer; a high speed pad connected to the write path circuit and the read path circuit for receiving and sending an electrical signal of the SDRAM through a PCB circuitry path; and a programmable loading test system for generating a test command to the SDRAM. The programmable loading test system includes: a mode register controller for selecting and configuring a test mode for the programmable loading test system; a programmable loading command sequence generator connected to the mode register controller and the SDRAM controller for generating a programmable loading command sequence and a general purpose command sequence based on a configuration of the mode register controller; a programmable loading command address generator connected to the mode register controller and the SDRAM controller for generating a programmable loading command address and a general purpose command address based on the configuration of the mode register controller; a programmable loading data burst length generator connected to the mode register controller and the SDRAM controller for generating a programmable loading data burst length and a general purpose data burst length based on the configuration of the mode register controller; a programmable loading write data background generator connected to the mode register controller and the SDRAM controller for generating a programmable loading write data background and a general purpose write data background based on the configuration of the mode register controller; a read data background checker connected to the mode register controller and the SDRAM controller for checking a read data output by the SDRAM controller based on the configuration of the mode register controller; and a write feedback checker connected to the demultiplexer for comparing a write data with a feedback write data by the SDRAM controller; wherein the write path circuit is short-circuited and the read path circuit is open-circuited when a write data test is performed on the SDRAM, and the read path circuit is connected to the write path circuit for feeding the write data back to the write feedback checker when a write feedback test is performed on the SDRAM.

Other objects, advantages, and novel features of the invention will become more apparent from the following detailed description when taken in conjunction with the accompanying drawings.

BRIEF DESCRIPTION OF THE DRAWINGS

FIG. 9 shows a table of SDRAM bus to system bus width ratio at different modes according to an embodiment of the invention;

FIG. 10 schematically illustrates the modes respectively of a programmable loading write data to system bus adapter and a programmable loading read data to system bus adapter according to an embodiment of the invention;

DETAILED DESCRIPTION OF THE PREFERRED EMBODIMENT

Figure 1:
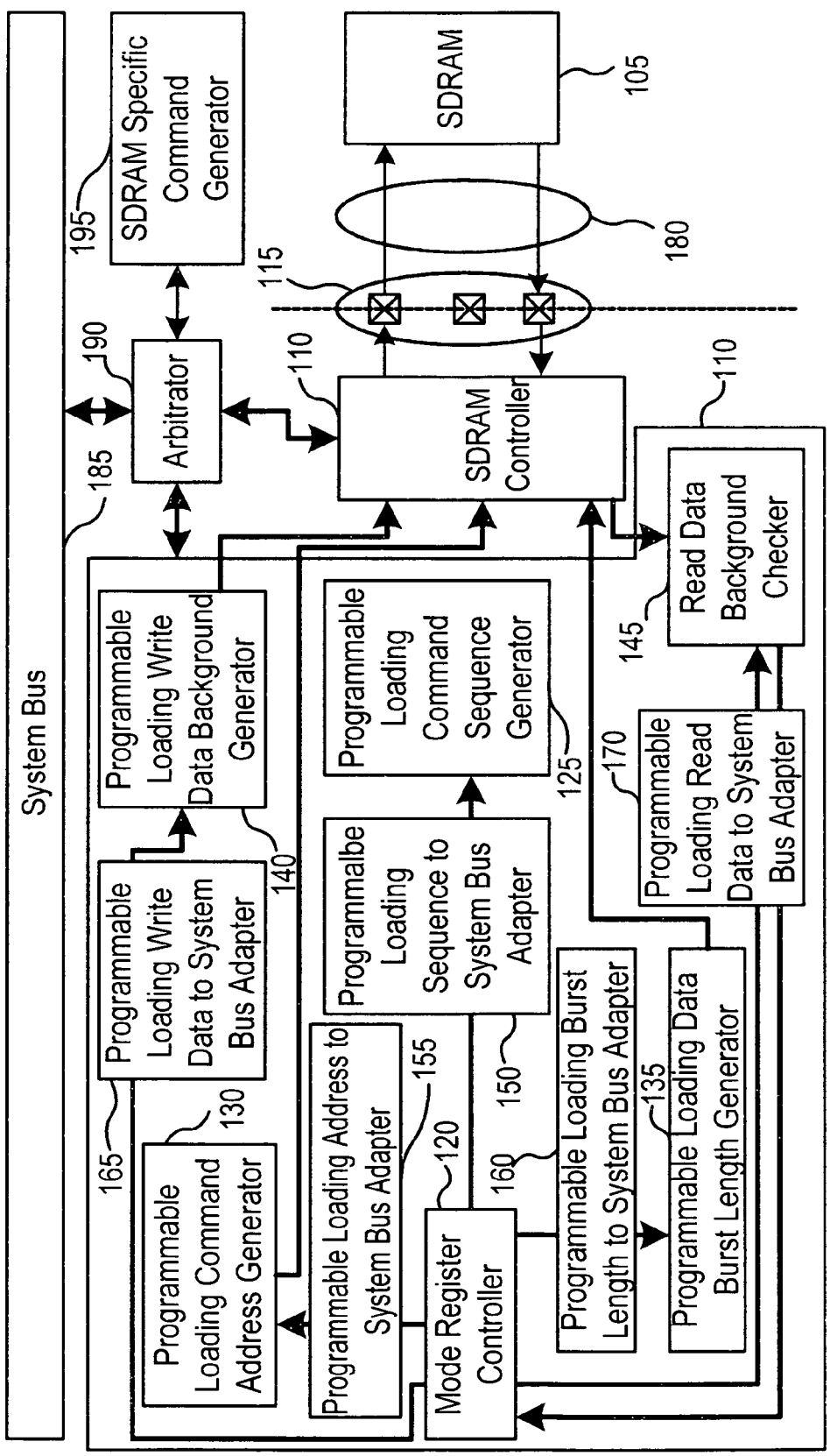
FIG. 1 is a block diagram of a memory test system with advance features for completed memory system according to an embodiment of the invention.

FIG. 1 is a block diagram of a memory test system with advance features for completed memory system according to an embodiment of the invention. The memory test system is implemented on a computer system to perform memory tests, and includes a synchronous dynamic random access memory (SDRAM) 105, a SDRAM controller 110, a high speed pad 115, a programmable loading test system 100, a system bus 185, a SDRAM specific command generator 195, and an arbitrator 190.

The programmable loading test system 100 includes a mode register controller 120, a programmable loading command sequence generator 125, a programmable loading command address generator 130, a programmable loading data burst length generator 135, a programmable loading write data background generator 140, a read data background checker 145, a programmable loading sequence to system bus adapter 150, a programmable loading address to system bus adapter 155, a programmable loading burst length to system bus adapter 160, a programmable loading write data to system bus adapter 165, and a programmable loading read data to system bus adapter 170.

The programmable loading test system 100 generates test commands to the SDRAM 105.

The SDRAM 105 stores data, which can be a main storage of the computer system. The SDRAM 105 has special control commands and a clock-defined memory, such as SDR SDRAM, DDR, DDR II, or DDR III.

The system bus 185 sends system bus commands from at least one master. The system bus 185 delivers typical read and write commands from the computer system. The system bus 185 includes an address bus, and a data bus.

The SDRAM specific command generator 195 generates SDRAM specific commands. The SDRAM specific commands include the commands of on-die-termination, self-refresh, auto-refresh, power-on initial, and power-off.

The arbitrator 190 is connected to the system bus 185, the SDRAM specific command generator 195, the programmable loading test system 100, and the SDRAM controller 110 in order to arbitrate memory access commands generated by the devices 185, 195 and 100 to further transfer one with the highest priority to the SDRAM controller 110.

The SDRAM controller 110 is connected to the system bus in order to process a system bus command of the computer system and thus generate a SDRAM standard command. All accesses to the SDRAM 105 are passed through the SDRAM controller 110.

The high speed pad 115 is connected to the SDRAM controller 110 and to the SDRAM 105 through a PCB circuitry path 180 in order to receive and send an electrical signal of the SDRAM 105.

The PCB circuitry path 180 is a communication channel between the SDRAM 105 and the SDRAM controller 110. It is required for a PCB design to meet with all circuitry timing and feature specification.

The SDRAM controller 110 is a slave of the computer system to receive commands transferred by the master. In a transmitting stage, the SDRAM controller 110 converts the commands transferred by the master into the SDRAM standard commands for sending them to the SDRAM 105 through the high speed pad 115 and the circuitry path 180. In a receiving stage, the SDRAM controller 110 receives the data output by the SDRAM 105 through the high speed pad 115 and the circuitry path 180, and converts the data into one meeting with a system bus standard.

The high speed pad 115 is designed to have the requirement of high speed transmission.

The programmable loading test system is based on the commands output by the computer system to perform a test. Namely, the computer system can command the programmable loading test system to generate a programmable loading test, a real case test, and a write feedback test.

The mode register controller 120 selects and configures a test mode for the programmable loading test system 100. The mode register controller 120 decides the modes of the programmable loading command sequence generator 125, the programmable loading command address generator 130, the programmable loading data burst length generator 135, the programmable loading write data background generator 140, and the read data background checker 145 respectively.

The programmable loading command sequence generator 125 is connected to the mode register controller 120 and the SDRAM controller 110 in order to generate a programmable loading command sequence and a general purpose command sequence based on the configuration of the mode register controller 120. The programmable loading command sequence generator 125 generates command sequences including the high command sequence, and processes the combinations of read and write commands of the memory interface.

The programmable loading command address generator 130 is connected to the mode register controller 120 and the SDRAM controller 110 in order to generate a programmable loading command address and a general purpose command address based on the configuration of the mode register controller 120. The programmable loading command address generator 130 has multiple address generating schemes to thereby generate the complicated addresses.

The programmable loading data burst length generator 135 is connected to the mode register controller 120 and the SDRAM controller 110 in order to generate a programmable loading data burst length and a general purpose data burst length based on the configuration of the mode register controller. The programmable loading data burst length generator 135 generates different burst lengths from one or more read commands, and each burst length introduces a different interrupt and data bus load.

The programmable loading write data background generator 140 is connected to the mode register controller 120 and the SDRAM controller 110 in order to generate a programmable loading write data background and a general purpose write data background based on the configuration of the mode register controller 120. The programmable loading write data background generator 140 provides various write data backgrounds. The programmable loading write data background generator 140 has a mode to help a DC test and slow speed test, and another mode to introduce a programmable loading data bus.

The read data background checker 145 is connected to the mode register controller 120 and the SDRAM controller 110 in order to check a read data output by the SDRAM controller 120 based on the configuration of the mode register controller 120. The read data background checker 145 compares the read data and the write data, and records the errors or mismatches to the computer system.

According to the correspondences in a computer system, the adapter 150 can be arranged between the controller 120 and the generator 125, the adapter 155 can be arranged between the controller 120 and the generator 130, the adapter 160 can be arranged between the controller 120 and the generator 135, the adapter 165 can be arranged between the controller 120 and the generator 140, and the adapter 170 can be arranged between the controller 120 and the generator 145.

The programmable loading sequence to system bus adapter 150 is connected between the mode register controller 120 and the programmable loading command sequence generator 125 in order to use the configuration of the mode register controller 120 and the differences between the system bus 185 and the SDRAM bus (not shown) of the SDRAM 105 to reprogram the programmable loading command sequence output by the programmable loading command sequence generator 125.

The programmable loading address to system bus adapter 155 is connected between the mode register controller 120 and the programmable loading command address generator 130 in order to use the configuration of the mode register controller 120 and the differences between the system bus 185 and the SDRAM bus of the SDRAM 105 to reprogram the programmable loading command address output by the programmable loading command address generator 130.

The programmable loading burst length to system bus adapter 160 is connected between the mode register controller 120 and the programmable loading data burst length generator 135 in order to use the configuration of the mode register controller 120 and the differences between the system bus 185 and the SDRAM bus of the SDRAM 105 to reprogram the programmable loading data burst length output by the programmable loading data burst length generator 135.

The programmable loading write data to system bust adapter 165 is connected between the mode register controller 120 and the programmable loading write data background generator 140 in order to use the configuration of the mode register controller 120 and the differences between the system bus 185 and the SDRAM bus of the SDRAM 105 to reprogram the programmable loading write data background output by the programmable loading write data background generator 140

The programmable loading read data to system bus adapter 170 is connected between the mode register controller 120 and the read data background checker 145 in order to use the configuration of the mode register controller 120 and the differences between the system bus 185 and the SDRAM bus of the SDRAM 105 to reprogram the read data output by the read data background checker 145.

Figure 2:
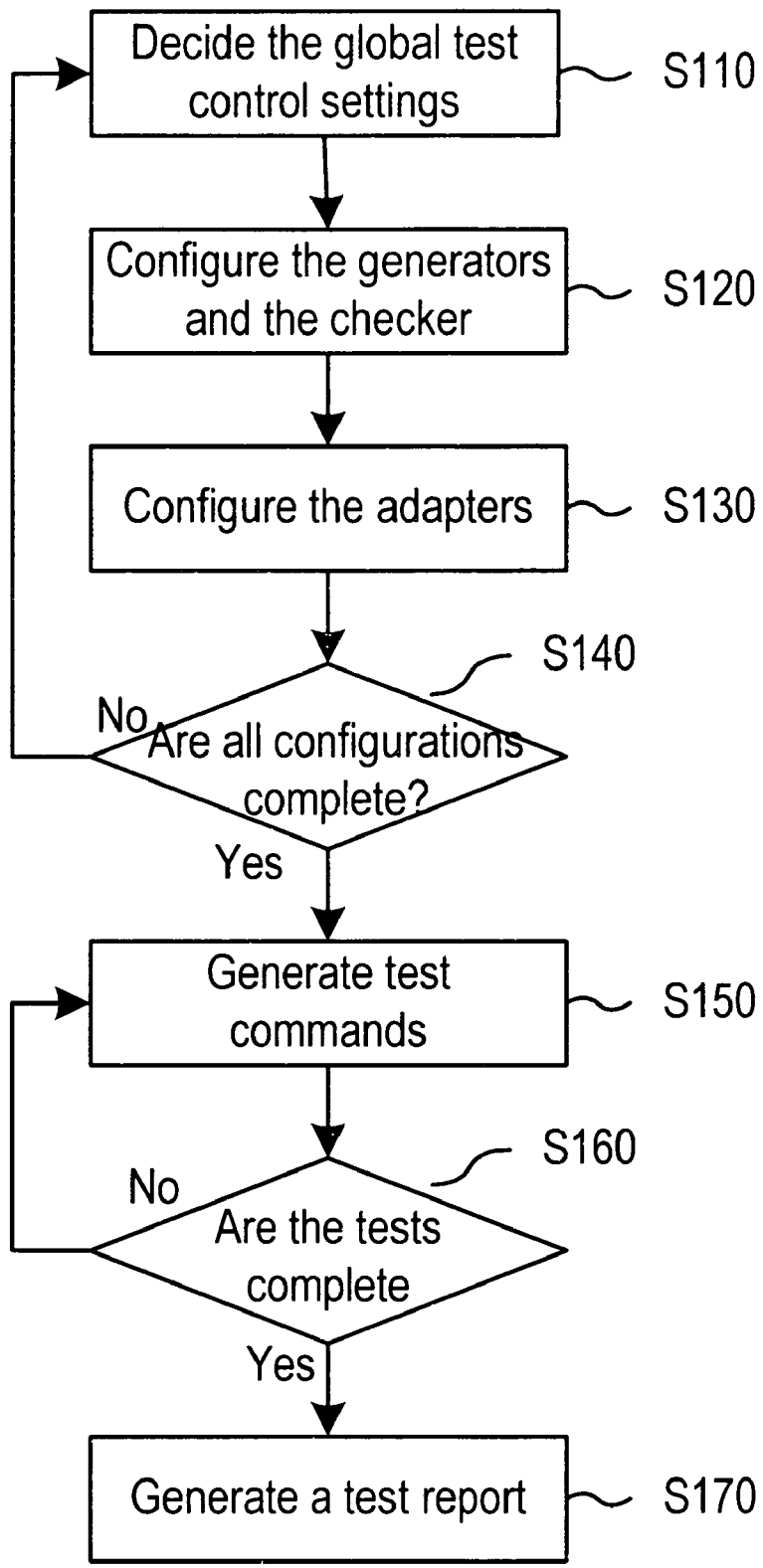
FIG. 2 is a flowchart of a memory test method with advance features for completed memory system according to an embodiment of the invention.

FIG. 2 is a flowchart of a memory test method with advance features for completed memory system according to an embodiment of the invention. In step S110, the mode register controller 120 checks the computer system to decide the global test control settings.

In step S120, the mode register controller 120 configures the programmable loading command sequence generator 125, the programmable loading command address generator 130, the programmable loading data burst length generator 135, the programmable loading write data background generator 140, and the read data background checker 145.

In step S130, the mode register controller 120 configures the programmable loading sequence to system bus adapter 150, the programmable loading address to system bus adapter 155, the programmable loading burst length to system bus adapter 160, the programmable loading write data to system bus adapter 165, and the programmable loading read data to system bus adapter 170.

Step S140 determines whether all configurations are complete or not, and step S110 is executed when any configuration is not complete, otherwise step S150 is executed to generate test commands to the SDRAM controller 110. While the test commands are arranged, a data bus sends a data request.

Step S160 determines whether the tests are complete or not, and step S150 is executed when any test is not complete, otherwise step S170 generates a test report.

The memory test method can divide a programmable loading command generation into a plurality of fields such as command sequence, command address, data burst length, and data background. Each field records a different test command, and also decides an individual test mode.

Figure 3:
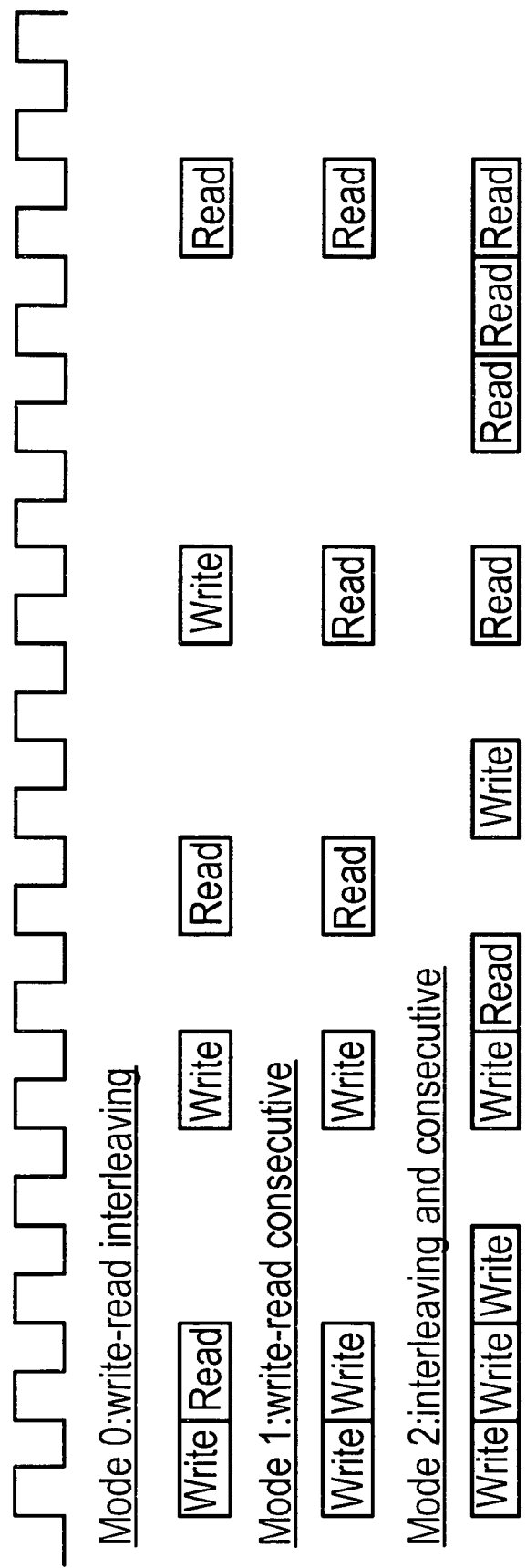
FIG. 3 schematically illustrates the modes of a programmable loading command sequence generator according to an embodiment of the invention.

FIG. 3 is a schematic diagram of modes of the programmable loading command sequence generator 125 according to an embodiment of the invention. As shown in FIG. 3, the programmable loading command sequence generator 125 generates the sequence test commands of write-read interleaving (mode 0), write-read consecutive (mode 1), and write-read interleaving and consecutive (mode 2). For clarity, only the command field is shown in FIG. 3.

The write command (WRITE) and the read command (READ) in mode 0 are interleaved in arrangement, such as in the sequence of WRITE, READ, WRITE, READ, WRITE, READ, and so on. The write command and the read command in mode 1 are consecutive in arrangement, such as in the sequence of WRITE, WRITE, WRITE, READ, READ, READ, and so on. The write command and the read command in mode 2 are arranged in interleaving and consecutive, such as in the sequence of WRITE, WRITE, WRITE, WRITE, READ, WRITE, READ, READ, READ, READ, and so on.

The programmable loading command sequence generator 125 can provide the strict command sequences to the memory test system with advance features for completed memory system, where the command sequence field can be mode 0 or 1.

Figure 4:
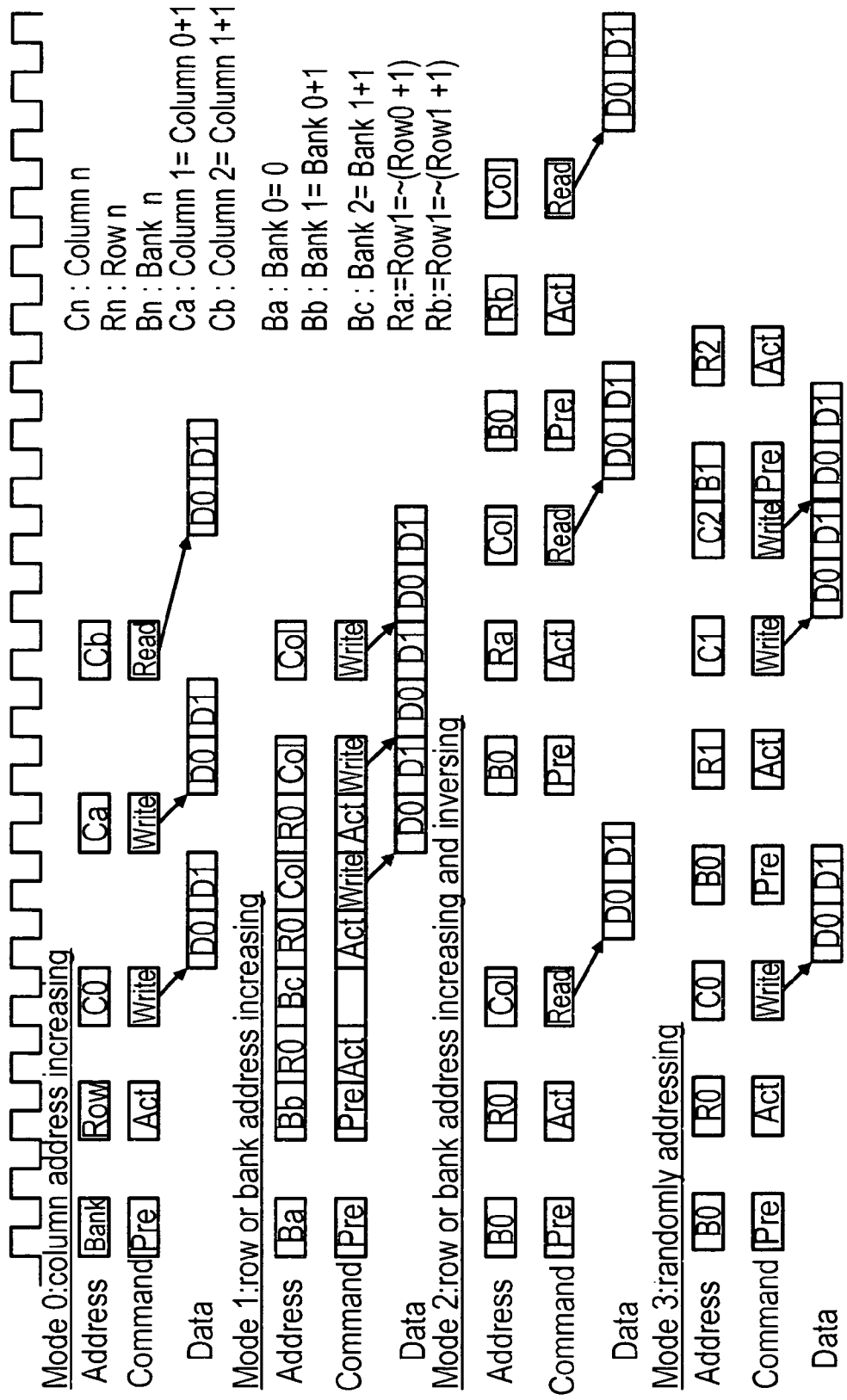
FIG. 4 schematically illustrates the modes of a programmable loading command address generator according to an embodiment of the invention.

FIG. 4 is a schematic diagram of modes of the programmable loading command address generator 130 according to an embodiment of the invention. As shown in FIG. 4, the programmable loading command address generator 130 generates the address test commands of column address increasing (mode 0), row or bank address increasing (mode 1), row or bank increasing and inversing (mode 2), and randomly addressing (mode 3).

Since the column address in mode 0 is increased for a sequence, such as COLUMN=0, COLUMN 1=COLUMN 0+1, COLUMN 2=COLUMN 1+1, the row or bank address is not reset necessarily, so the data in the SDRAM 105 can be stored more consecutive.

Since the row or bank address in mode 1 is increased for a sequence, such as BANK 0, BANK 1=BANK 0+1, BANK 2=BANK 1+1, the SDRAM controller 110 frequently needs to generate pre-charge and active commands.

Since the row or bank address in mode 2 is increased and inversed for a sequence, such as ROW 0, ROW 1=~(ROW 0+1), ROW 2=~(ROW 1+1), the SDRAM controller 110 needs to severely switch the row or bank address, in addition to the pr-charge command and the active command.

Since a sequence in mode 3 is randomly addressed, the address required for a switch is riot severe.

The programmable loading command address generator 130 can provide the strict command addresses to the memory test system with advance features for completed memory system, where mode 0 is optimal for a programmable loading data transfer, mode 1 is optimal for a pre-charge and active operation, and mode 2 is optimal when an address is considered.

Figure 5:
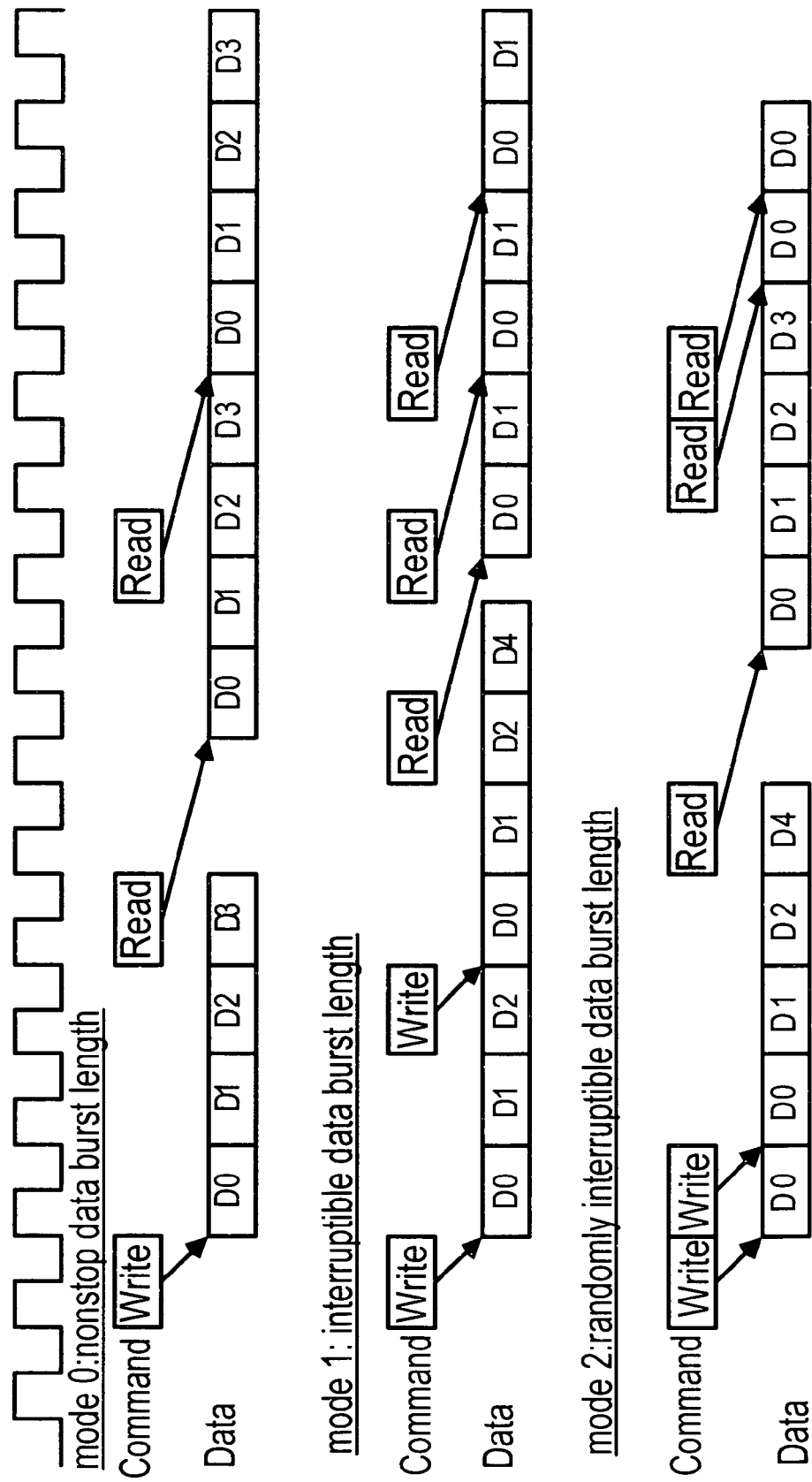
FIG. 5 schematically illustrates the modes of a programmable loading data burst length generator according to an embodiment of the invention.

FIG. 5 is a schematic diagram of modes of the programmable loading data burst length generator 135 according to an embodiment of the invention. As shown in FIG. 5, the programmable loading data burst length generator 135 generates the data burst test commands of nonstop data burst length (mode 0), interruptible data burst length (mode 1), and randomly interruptible data burst length (mode 2).

In mode 0, the data on data burst transmission is not interrupted by other commands, until the data burst length is complete. In mode 1, the data on data burst transmission can be interrupted by other commands. In mode 2, it is randomly decided whether the data on data burst transmission is interrupted by other commands before the data burst length is complete.

The programmable loading data burst length generator 135 can provide the strict test data burst length combinations to the memory test system with advance features for completed memory system, where mode 0 is optimal for a programmable loading data transfer, and mode 1 is optimal for a programmable loading command transfer.

Figure 6:
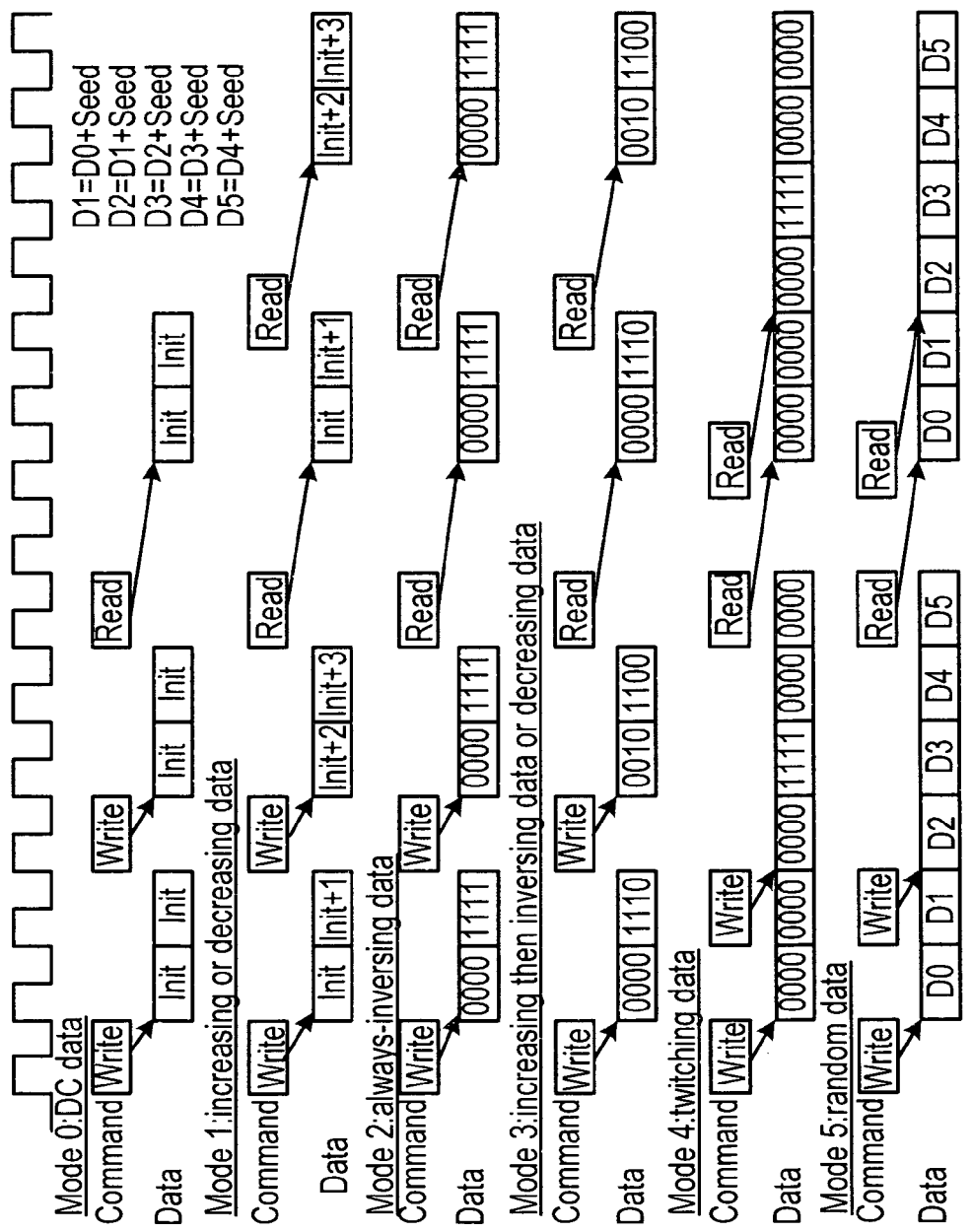
FIG. 6 schematically illustrates the modes of a programmable loading write data background generator according to an embodiment of the invention.

FIG. 6 is a schematic diagram of modes of the programmable loading write data background generator 140 according to an embodiment of the invention. As shown in FIG. 6, the programmable loading write data background generator 140 generates the write data background test commands of DC data (mode 0), increasing or decreasing data (mode 1), always-inversing data (mode 2), increasing then inversing data or decreasing data (mode 3), twitching data (mode 4), and random data (mode 5).

In mode 0, the programmable loading write data background generator 140 generates a write data and keeps it the same as its initial value at generation. Since the write data is remained unchanged, it is referred to as a DC write data. In mode 1, the programmable loading write data background generator 140 increases or decreases a write data generated, such as D0, D0+1, D0+2 ..., or D0, D0−1, D0−2 ... (as those Init, Init+1, Init+2, Init+3 shown in FIG. 6). In mode 2, the programmable loading write data background generator 140 always inverses a write data generated, such as D0, ~D0, D0, ~D0 ... (as those 0000, 1111 shown in FIG. 6).

In mode 3, the programmable loading write data background generator 140 increases and inverses a write data generated, such as D0, D1=~(D0+1), D2=~(D1+1) ... (as those 0000, 1110, 0010, 1100 shown in FIG. 6). In mode 4, the programmable loading write data background generator 140 generates the DC write data similar to mode 0 and randomly inverses a part or parts of the DC write data, such as D0, D0, D0, ~D0, ... (as those 0000, 0000, 0000, 1111, 0000, 0000 shown in FIG. 6). In mode 5, the programmable loading write data background generator 140 randomly generates the write data, such as D0, D1=D0+random(seed), D2=D1+random (seed), D3=D2+random(seed), D4=D3+random(seed), D5=D4+random(seed), wherein random( )indicates a random generator to generate the data based on a seed.

The programmable loading write data background generator 140 can provide the strict write data to the memory test system with advance features for completed memory system. Mode 0 provides the DC test, which is the first test item in the initial test stage. Mode 1 provides an increased or decreased data value, which can be debugged easily in such a simple data type. Mode 2 provides an inversed data type to thereby shift the data bus signal at high and low voltages in random, which is the most particular test pattern in the high load transmission.

Mode 3 is developed from mode 2, which can test the worse condition in the high load transmission. Mode 4 provides the simultaneous data switch test in the DC data. Such a test pattern can generate the bigger transient current requirement and stronger noise interference on system power signal, ground signal, data signal, and control signal. Mode 5 provides the random data type.

In this embodiment, the programmable loading sequence to system bus adapter 150, the programmable loading address to system bus adapter 155, the programmable loading burst length to system bus adapter 160, the programmable loading write data to system bus adapter 165, and the programmable loading read data to system bus adapter 170 play an important role. By means of the adapters, the programmable loading test system 100 with advance features for completed memory system can be compatible with other computer systems.

Figures 7, 8:
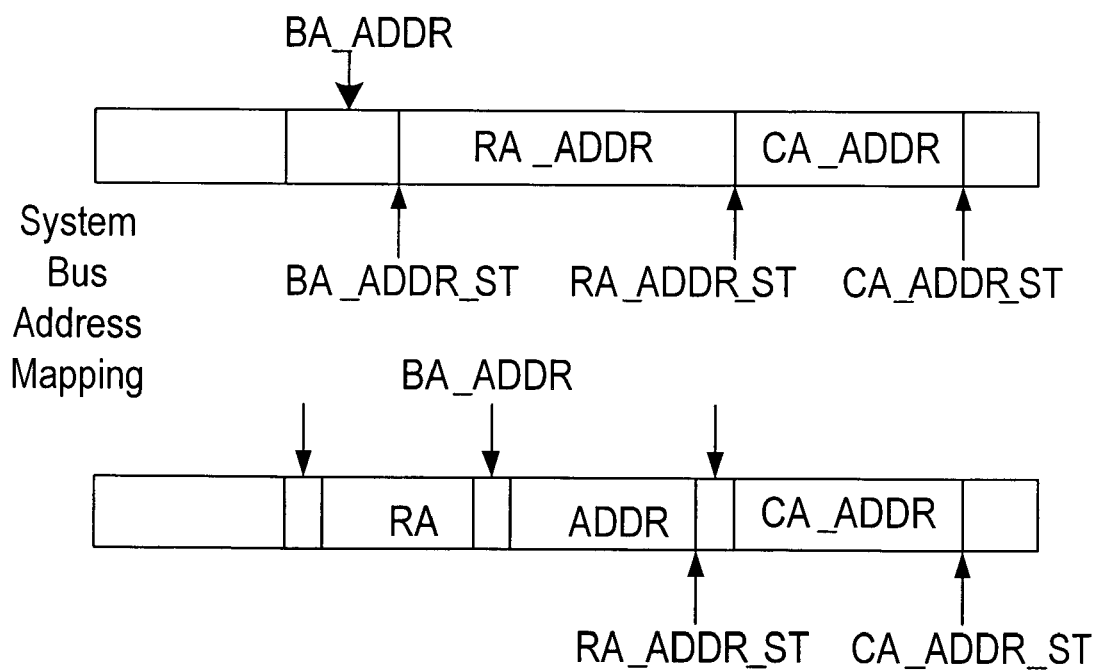
FIG. 7 shows a table of SDRAM bus to system bus command ratio at different modes according to an embodiment of the invention.
FIG. 8 is a schematic diagram of a 3D address mapping in a programmable loading address to system bus adapter according to an embodiment of the invention.

The programmable loading sequence to system bus adapter 150 is connected between the mode register controller 120 and the programmable loading command sequence generator 125. In the computer system, the required commands of a master can be translated into a plurality of SDRAM commands, and accordingly the programmable loading command sequence can be translated into the combinations of the SDRAM commands. FIG. 7 is a table of SDRAM bus to system bus command ratio at different modes according to an embodiment of the invention, which shows five modes of the programmable loading sequence to system bus adapter 150. As shown in FIG. 7, the programmable loading sequence generation is perfect based on HLS Adapt Factor.

The programmable loading address to system bus adapter 155 is connected between the mode register controller 120 and the programmable loading command address generator 130. In the computer system, the address of the system bus can have a different unit than the address of the SDRAM bus. For example, the system bus address can be in a unit of byte, and the SDRAM bus address can be 4 or 16 bits. Moreover, the address filed of the system bus is typically one-dimensional, while the address filed of the SDRAM bus is typically multi-dimensional. To overcome this problem, the programmable loading address to system bus adapter 155 requires a corresponding one-dimensional address, and remaps the programmable loading SDRAM address back to the one-dimensional command address field. FIG. 8 is a schematic diagram of a three-dimensional address mapping in the programmable loading address to system bus adapter 155 according to an embodiment of the invention.

The programmable loading burst length to system bus adapter 160 is connected between the mode register controller 120 and the programmable loading data burst length generator 135. In the computer system, the data burst length of the system bus is necessarily changed into that of the SDRAM bus. FIG. 9 is a table of the SDRAM bus to system bus width ratio at different modes according to an embodiment of the invention, which shows the nine modes of the programmable loading burst length to system bus adapter 160. As shown in FIG. 9, the programmable loading data burst length is complete with HLB Adapt Factor.

The programmable loading write data to system bust adapter 165 is connected between the mode register controller 120 and the programmable loading write data background generator 140. The programmable loading read data to system bus adapter 170 is connected between the mode register controller 120 and the read data background checker 145. In the computer system, the data background is the same as the SDRAM bus. FIG. 10 is a schematic diagram of modes respectively of the programmable loading write data to system bus adapter 165 and the programmable loading read data to system bus adapter 170 according to an embodiment of the invention. In mode 0, the SDRAM bus is four times the system bus, i.e., the system bus is one fourth of the SDRAM bus. In mode 3, the SDRAM bus is two times the system bus, so the system bus is divided into two SDRAM data, D0 and D1.

Figure 11:
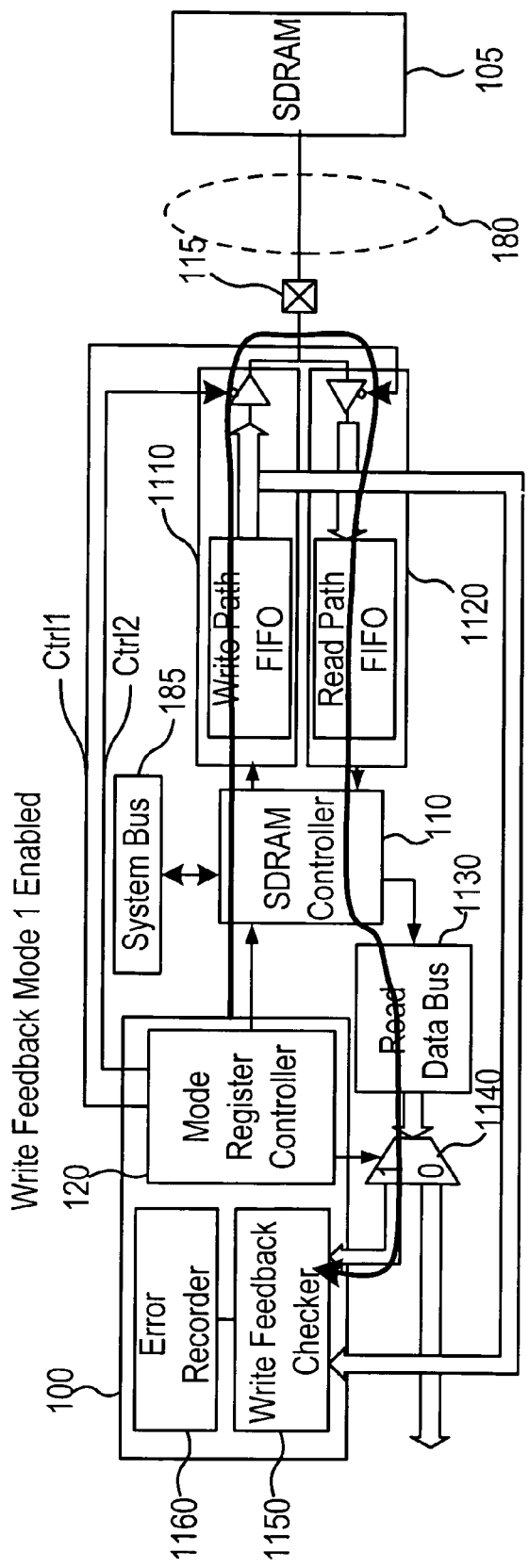
FIG. 11 is a schematic diagram of a programmable loading test system with advance features for completed memory system according to another embodiment of the invention.

FIG. 11 is a schematic diagram of a programmable loading test system with advance features for completed memory system according to another embodiment of the invention. In FIG. 11, the programmable loading test system 100 is used in a memory test system. This embodiment is similar to the previous one shown in FIG. 1, except that a write path circuit 1110, a read path circuit 1120, a read data bus 1130, a demultiplexer 1140, a write feedback checker 1150, and an error recorder 1160 are added.

The write path circuit 1110 is connected to the SDRAM controller 110 in order to provide a write path.

The read path circuit 1120 is connected to the SDRAM controller 110 in order to provide a read path.

The high speed pad 115 is connected to the write path circuit 1110 and the read path circuit 1120, and connected to the SDRAM 110 through a PCB circuitry path 180 in order to receive and send an electrical signal of the SDRAM 105.

When a memory write data test is performed, the mode register controller 120 uses the control signal "ctrl1 " to control the write path circuit 1110, and uses the control signal "ctrl1" to control the read path circuit 1120, so that the write path circuit 1110 is short-circuited, and the read path circuit 1120 is open-circuited. When a memory write feedback test is performed, the mode register controller 120 uses the control signal "ctrl1" to control the write path circuit 1110, and uses the control signal "ctrl2" to control the read path circuit 1120, so that the read path circuit 1120 is connected to the write path circuit 1110 to thereby feed a write data back to the write feedback checker. Namely, the write data returns to the programmable loading test system 110 through the mode register controller 120, the SDRAM controller 110, the write path circuit 1110, the read path circuit 1120, the read data bus 1130, and the demultiplexer 1140. The write feedback checker 1150 of the programmable loading test system 100 checks the write and the feedback data, and the error recorder 1160 records the error data for further processing.

Figure 12:
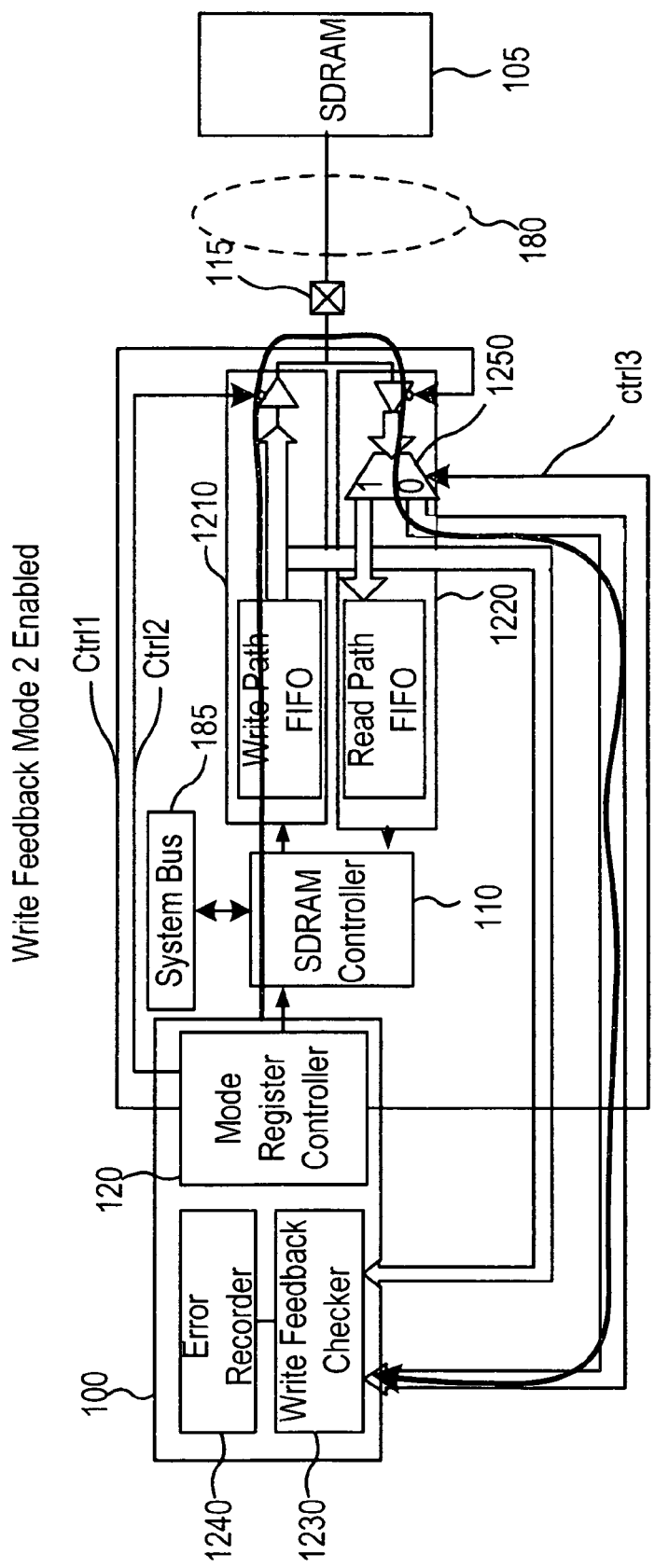
FIG. 12 is a schematic diagram of a programmable loading test system with advance features for completed memory system according to another embodiment of the invention.

FIG. 12 is a schematic diagram of a programmable loading test system with advance features for completed memory system according to another embodiment of the invention. In FIG. 12, the programmable loading test system 100 is used in a memory test system. This embodiment is similar to the first one shown in FIG. 1, except that a write path circuit 1210, a read path circuit 1220, a write feedback checker 1230, and an error recorder 1240 are added. The read path circuit 1220 has a demultiplexer 1250.

The write path circuit 1210 is connected to the SDRAM controller 110 in order to provide a write path.

The read path circuit 1220 is connected to the SDRAM controller 110 in order to provide a read path.

The high speed pad 115 is connected to the write path circuit 1210 and the read path circuit 1220, and connected to the SDRAM 110 through a PCB circuitry path 180 in order to receive and send an electrical signal of the SDRAM 105.

When a memory write data test is performed, the mode register controller 120 uses the control signal "ctrl1" to control the write path circuit 1210, and uses the control signal "ctrl2" to control the read path circuit 1220, so that the write path circuit 1210 is short-circuited, and the read path circuit 1120 is open-circuited. When a memory write feedback test is performed, the mode register controller 120 uses the control signal "ctrl1" to control the write path circuit 1210, uses the control signal "ctrl2" to control the read path circuit 1220, and uses the control signal "ctrl3" to control the demultiplexer 1250, so that the read path circuit 1220 is connected to the write path circuit 1210, and an output of the demultiplexer 1250 is directly sent to the write feedback checker 1230.

All components cited above can be integrated into a single IC except for the SDRAM to thereby have the smaller area design and reduce the chip power consumption.

As cited, the invention discloses a reliable memory test system for a computer, which can solve the test problems caused by the high speed memory interface and SDRAM to thereby perform a programmable loading test, a read case test, and a write feedback test. Therefore, the memory test system has high reliability. In addition, the hardware components of the invention can be independently configured to generate versatile test patterns. Besides testing the system at high speed, the write feedback test can independently test a memory controller which is embedded in an integrated circuit without communicating with the external SDRAM. In the integrated circuit verification stage, the invention can give a support for analyzing and distinguishing the problems inside or outside of the integrated circuit, and generate individual write and read commands.

Although the present invention has been explained in relation to its preferred embodiment, it is to be understood that many other possible modifications and variations can be made without departing from the spirit and scope of the invention as hereinafter claimed.

What is claimed is:

1. A memory test system with advance features for completed memory system, comprising:
   a synchronous dynamic random access memory (SDRAM) for storing data;
   a system bus for sending a system bus command from a master;
   a SDRAM controller connected to the system bus for processing the system bus command and generating a SDRAM standard command;
   a high speed pad connected to the SDRAM controller and to the SDRAM through a PCB circuitry path for receiving and sending an electrical signal of the SDRAM; and
   a programmable loading test system for generating a test command to the SDRAM, wherein the programmable loading test system includes:
   a mode register controller for selecting and configuring a test mode for the programmable loading test system;
   a programmable loading command sequence generator connected to the mode register controller and the SDRAM controller for generating a programmable loading command sequence and a general purpose command sequence based on a configuration of the mode register controller;
   a programmable loading command address generator connected to the mode register controller and the SDRAM controller for generating a programmable loading command address and a general purpose command address based on the configuration of the mode register controller;
   a programmable loading data burst length generator connected to the mode register controller and the SDRAM controller for generating a programmable loading data burst length and a general purpose data burst length based on the configuration of the mode register controller;
   a programmable loading write data background generator connected to the mode register controller and the SDRAM controller for generating a programmable loading write data background and a general purpose write data background based on the configuration of the mode register controller; and
   a read data background checker connected to the mode register controller and the SDRAM controller for checking a read data output by the SDRAM controller based on the configuration of the mode register controller.

2. The memory test system as claimed in claim 1, wherein the programmable loading test system comprises:
   a programmable loading sequence to system bus adapter connected between the mode register controller and the programmable loading command sequence generator for reprogramming the programmable loading command sequence output by the programmable loading command sequence generator according to the configuration of the mode register controller and differences between the system bus and a SDRAM bus of the SDRAM;
   a programmable loading address to system bus adapter connected between the mode register controller and the programmable loading command address generator for to reprogramming the programmable loading command address output by the programmable loading command address generator according to the configuration of the mode register controller and the differences between the system bus and the SDRAM bus of the SDRAM;
   a programmable loading burst length to system bus adapter connected between the mode register controller and the programmable loading data burst length generator for to reprogramming the programmable loading data burst length output by the programmable loading data burst length generator according to the configuration of the mode register controller and the differences between the system bus and the SDRAM bus of the SDRAM;
   a programmable loading write data to system bust adapter connected between the mode register controller and the programmable loading write data background generator for to reprogramming the programmable loading write data background output by the programmable loading write data background generator according to the configuration of the mode register controller and the differences between the system bus and the SDRAM bus of the SDRAM; and
   a programmable loading read data to system bus adapter connected between the mode register controller and the read data background checker for reprogramming the read data output by the read data background checker according to the configuration of the mode register controller and the differences between the system bus and the SDRAM bus of the SDRAM.

3. The memory test system as claimed in claim 2, wherein the programmable loading command sequence generator generates a sequence test command of write-read consecutive, write-read interleaving, or write-read consecutive and interleaving.

4. The memory test system as claimed in claim 2, wherein the programmable loading command address generator generates an address test command of column address increasing, row or bank address increasing, row or bank address increasing and inversing, or random addressing.

5. The memory test system as claimed in claim 2, wherein the programmable loading data burst length generator generates a data burst test command of nonstop data burst length, interruptible data burst length, or randomly interruptible data burst length.

6. The memory test system as claimed in claim 2, wherein the programmable loading write data background generator generates a write data background test mode of DC data, increasing or decreasing data, always-inversing data, increasing then inversing data or decreasing data, twitching data, or random data.

7. The memory test system as claimed in claim 2, further comprising:
   a SDRAM specific command generator for generating a SDRAM specific command; and
   an arbitrator connected to the system bus, the SDRAM specific command generator, the programmable loading test system, and the SDRAM controller for arbitrating memory access commands generated by the system bus, the SDRAM specific command generator, and the programmable loading test system to further transfer one with the highest priority to the SDRAM controller.

8. The memory test system as claimed in claim 7, wherein the SDRAM specific command is used as an internal on-die-termination, self-refresh, auto-refresh, power-on initial, or power-off command.

9. A memory test system with advance features for completed memory system, comprising:
a SDRAM for storing data;
a system bus for sending a system bus command from a master;
a SDRAM controller connected to the system bus for processing the system bus command and generating a SDRAM standard command;
a write path circuit connected to the SDRAM controller for providing a write path;
a read path circuit connected to the SDRAM controller for providing a read path;
a high speed pad connected to the write path circuit and the read path circuit for receiving and sending an electrical signal of the SDRAM through a PCB circuitry path; and
a programmable loading test system for generating a test command to the SDRAM, wherein the programmable loading test system includes:
a mode register controller for selecting and configuring a test mode for the programmable loading test system;
a programmable loading command sequence generator connected to the mode register controller and the SDRAM controller for generating a programmable loading command sequence and a general purpose command sequence based on a configuration of the mode register controller;
a programmable loading command address generator connected to the mode register controller and the SDRAM controller for generating a programmable loading command address and a general purpose command address based on the configuration of the mode register controller;
a programmable loading data burst length generator connected to the mode register controller and the SDRAM controller for generating a programmable loading data burst length and a general purpose data burst length based on the configuration of the mode register controller;
a programmable loading write data background generator connected to the mode register controller and the SDRAM controller for generating a programmable loading write data background and a general purpose write data background based on the configuration of the mode register controller;
a read data background checker connected to the mode register controller and the SDRAM controller for checking a read data output by the SDRAM controller based on the configuration of the mode register controller; and
a write feedback checker connected to the SDRAM controller for receiving a write data and comparing the received write data with a feedback write data by the SDRAM controller;
wherein the write path circuit is short-circuited and the read path circuit is open-circuited when a memory write data test is performed on the SDRAM, and the read path circuit is connected to the write path circuit for feeding the write data back to the write feedback checker when a memory write feedback test is performed on the SDRAM.

10. A memory test system with advance features for completed memory system, comprising:
a SDRAM for storing data;
a system bus for sending a system bus command from a master;
a SDRAM controller connected to the system bus for processing the system bus command and generating a SDRAM standard command;
a write path circuit connected to the SDRAM controller for providing a write path;
a read path circuit connected to the SDRAM controller for providing a read path, wherein the read path circuit includes a demultiplexer;
a high speed pad connected to the write path circuit and the read path circuit for receiving and sending an electrical signal of the SDRAM through a PCB circuitry path; and
a programmable loading test system for generating a test command to the SDRAM, wherein programmable loading test system includes:
a mode register controller for selecting and configuring a test mode for the programmable loading test system;
a programmable loading command sequence generator connected to the mode register controller and the SDRAM controller for generating a programmable loading command sequence and a general purpose command sequence based on a configuration of the mode register controller;
a programmable loading command address generator connected to the mode register controller and the SDRAM controller for generating a programmable loading command address and a general purpose command address based on the configuration of the mode register controller;
a programmable loading data burst length generator connected to the mode register controller and the SDRAM controller for generating a programmable loading data burst length and a general purpose data burst length based on the configuration of the mode register controller;
a programmable loading write data background generator connected to the mode register controller and the SDRAM controller for generating a programmable loading write data background and a general purpose write data background based on the configuration of the mode register controller;
a read data background checker connected to the mode register controller and the SDRAM controller for checking a read data output by the SDRAM controller based on the configuration of the mode register controller; and
a write feedback checker connected to the demultiplexer for comparing a write data with a feedback write data by the SDRAM controller;
wherein the write path circuit is short-circuited and the read path circuit is open-circuited when a write data test is performed on the SDRAM, and the read path circuit is connected to the write path circuit for feeding the write data back to the write feedback checker when a write feedback test is performed on the SDRAM.

* * * * *